United States Patent [19]
Minagawa

[11] 4,393,353
[45] Jul. 12, 1983

[54] NEGATIVE FEEDBACK AMPLIFYING CIRCUIT HAVING VOLTAGE NEGATIVE FEEDBACK AND CURRENT NEGATIVE FEEDBACK CIRCUITS

[75] Inventor: Hiroyasu Minagawa, Yamato, Japan
[73] Assignee: Victor Company of Japan, Ltd., Yokohama, Japan
[21] Appl. No.: 191,355
[22] Filed: Sep. 26, 1980
[30] Foreign Application Priority Data
    Sep. 28, 1979 [JP] Japan .............. 54-134344[U]
[51] Int. Cl.³ .................................... H03F 1/32
[52] U.S. Cl. ............................. 330/102; 330/109;
                                    330/294; 179/1 A; 179/1 F
[58] Field of Search .............. 330/94, 102, 105, 107,
                                    330/109, 294; 179/1 A, 1 F

[56] References Cited
U.S. PATENT DOCUMENTS 3,972,002  7/1976  Aprille, Jr. ............... 330/102 X
4,229,618  10/1980  Gamble ...................... 179/1 F

*Primary Examiner*—James B. Mullins
*Attorney, Agent, or Firm*—Michael N. Meller; Anthony H. Handal

[57] ABSTRACT

A negative feedback amplifying circuit comprises an amplifier connected to a load, a voltage negative feedback circuit which negatively feeds back the output voltage of the amplifier to the input side of the amplifier maintaining a frequency selection characteristic, and a current negative feedback circuit which negatively feeds back a current signal obtained by detecting the current flowing through the load to the input side of the amplifier maintaining a frequency selection characteristic. The voltage negative feedback circuit has a frequency selection characteristic comprising a dip at a specific frequency $f_0$. On the other hand, the current negative feedback circuit has a frequency characteristic comprising a peak at a specific frequency $f_0$.

6 Claims, 5 Drawing Figures

NEGATIVE FEEDBACK AMPLIFYING CIRCUIT HAVING VOLTAGE NEGATIVE FEEDBACK AND CURRENT NEGATIVE FEEDBACK CIRCUITS

BACKGROUND OF THE INVENTION

The present invention relates generally to a negative feedback amplifying circuit, and more particularly to a negative feedback amplifying circuit having a voltage negative feedback circuit and a current negative feedback circuit and performing an ideal for reactance load.

Generally, low-frequency amplifiers have negative feedback circuits to reduce the distortion of a signal and generation of noise. Especially, most of the low-frequency amplifiers which supply signals to speakers by amplifying audio signals have negative feedback circuits.

Therefore, majority of the speakers are generally determined of their sound quality by their driving voltage. Accordingly, when the load of the amplifier is a speaker, a voltage negative feedback amplifier is used as an amplifier so as not to cause unfavorable effect on the sound quality and the like.

However, voltage negative feedback amplifiers generally exhibit satisfactory performance when the load is of pure resistance, but when the load is a reactance load such as a speaker, the current distortion is not improved by the negative feedback. Furthermore, in the above case where the load is a reactance such as a speaker, low-frequency resonance due to mechanical impedance is unavoidably introduced at the speaker, and negative impedance in the vicinity of the minimum resonance frequency $f_0$ of the above low-frequency resonance is increased, resulting in a drawback in that the sound pressure level decreased.

SUMMARY OF THE INVENTION

Accordingly, it is a general object of the present invention to provide a novel and useful negative feedback amplifying circuit having voltage negative feedback and current negative feedback circuits.

Another and specific object of the invention is to provide a negative feedback amplifying circuit having a voltage negative feedback circuit and a current negative feedback circuit which detects the flowing current in the load. Both the voltage negative feedback circuit and current negative feedback circuit operate at the minimum resonance frequency $f_0$, and only the voltage negative feedback circuit operates at frequency bands other than the minimum resonance frequency $f_0$. The voltage distortion and current distortion can both be reduced in great extent according to the characteristic of the load, even when the above load is a reactance load. When the above load is a speaker, the voltage distortion is reduced by the operation of the above voltage negative feedback circuit in the frequency bands other than the minimum resonance frequency $f_0$ of the speaker, and solely at the minimum resonance frequency $f_0$, the current distortion of the current flowing through a voice coil of the speaker is drastically improved by the above current negative feedback circuit. Furthermore, by giving a frequency selection characteristic so that the feedback quantity of the above voltage negative feedback circuit is minimum at the frequency $f_0$, the speaker can be driven at a constant power level in all the predetermined frequency bands including the frequency $f_0$, and thus the sound pressure level at the above frequency bands becomes flat, and extremely low sounds can be reproduced.

Still another object of the invention is to provide a negative feedback amplifying circuit having a simulated inductance circuit so that the series resonance circuit of the above voltage negative feedback circuit and current negative feedback circuit in reality has a simulated inductance within the series resonance circuit.

Other objects and further features of the present invention will be apparent from the following detailed description with respect to preferred embodiments of the invention when read in conjunction with the accompanying drawings.

DETAILED DESCRIPTION

Figure 1:
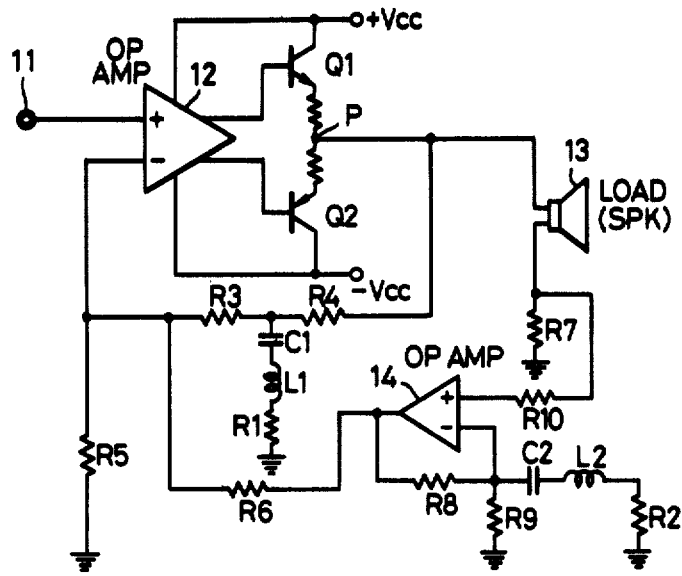
FIG. 1 is a circuit diagram showing a first embodiment of a negative feedback amplifying circuit of the present invention.

One embodiment of a negative feedback amplifying circuit according to the present invention will first be described in conjunction with FIG. 1. An input audio signal applied to an input terminal 11 is supplied to a non-inverting input terminal of an operational amplifier 12. The output of the operational amplifier 12 is supplied to the base electrodes of NPN transistor Q1 and PNP transistor Q2 respectively having emitter electrodes connected through resistors. A connection point P of the emitter resistors of the transistors Q1 and Q2 is connected to a load 13, and an output signal introduced at the point P is supplied to the load 13. In this embodiment, a speaker is used as the load 13.

The point P is also connected, through resistors R4 and R3, to an inverting input terminal of the operational amplifier 12. A resistor R5 is connected between this inverting input terminal and ground. In addition, a series resonance circuit comprising a capacitor C1, a coil L1, and a resistor R1 connected in series, is connected between ground and the connection point between resistors R3 and R4. These circuits form a voltage negative feedback circuit.

The load 13 is grounded through a current detecting resistor R7 (its resistance value is 0.1–0.2 Ω, for example), and also connected to a non-inverting input of an operational amplifier 14 through a resistor R10. A resistor R9 is connected between an inverting input of the operational amplifier 14 and the ground. A series resonance circuit comprising a capacitor C2, a coil L2, and a resistor R2 connected in series, is connected in parallel with the resistor R9. A feedback resistor R8 is connected between the output terminal and the inverting input terminal of the operational amplifier 14. The output terminal of the operational amplifier 14 is also connected to an inverting input terminal of the operational amplifier 12 through a resistor R6. These circuits form a current negative feedback circuit.

The resonance frequency of the series resonance circuit comprising the capacitor C1, coil L1, and resistor R1 within the above voltage negative feedback circuit, is selected so as to be coincident with the minimum resonance frequency $f_0$ (normally a frequency lower than 100 Hz) of the speaker employed as the load 13. When considering a circuit excluding the current negative feedback circuit including the resistor R6, the frequency characteristic of the voltage negative feedback circuit shows a band-elimination filter characteristic comprising a dip at the frequency $f_0$ as shown by the curve I of FIG. 2.

Furthermore, the resonance frequency of the series connected resonance circuit comprising the capacitor C2, coil L2, and resistor R2 within the above current negative feedback circuit, is also selected at the above frequency $f_0$. The impedance of the series resonance circuit becomes minimum at this resonance frequency $f_0$, and thus the gain of the operational amplifier 14 becomes maximum at the resonance frequency $f_0$. Accordingly, when considering a circuit excluding the voltage negative feedback circuit comprising resistor R3, the frequency characteristic of the current negative feedback circuit shows a frequency selection characteristic comprising a peak at the frequency $f_0$ as shown by the curve II in FIG. 2.

Hence, the voltage amplified and obtained from the operational amplifier 12 and applied to the load (speaker) 13, is negatively fed back to the operational amplifier 12 through the above voltage negative feedback circuit, and a voltage corresponding to the current flowing through the load 13 obtained from both ends of the resistor R7 is negatively fed back to the operational amplifier 12 through the above current negative feedback circuit.

The impedance value of the speaker used as the load 13 at the minimum resonance frequency $f_0$, is several to several ten times the nominal impedance value of the speaker. Therefore, at the frequency $f_0$, the current which flows through the speaker as compared to the current which flows at frequencies other than the frequency $f_0$ greatly decreases, but as shown by the curve II of FIG. 2, the negative feedback quantity of the current negative feedback circuit having a characteristic including a peak at the frequency $f_0$ does not vary substantially by much, and on the other hand, the negative feedback quantity of the voltage negative feedback circuit becomes quite small at the frequency $f_0$ as shown by the curve I of FIG. 2. Accordingly, the negative feedback quantity as a whole decreases in great extent at the frequency $f_0$. As a result, the gain of the negative feedback amplifier shown in FIG. 1 becomes large at the above frequency $f_0$, and the frequency characteristic becomes of the form shown in FIG. 3 comprising a peak at the frequency $f_0$.

Figure 3:
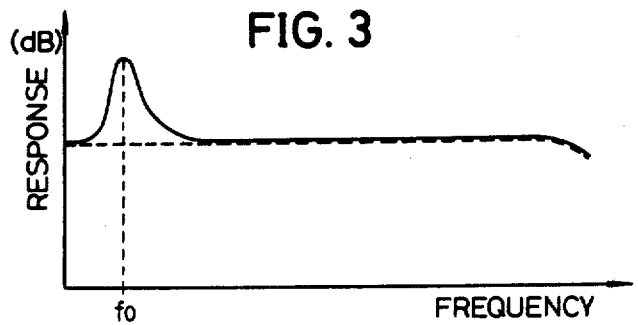
FIG. 3 is a graph showing one example of the frequency characteristic of the negative feedback amplifying circuit of FIG. 1.

Thus, the speaker can be driven at the same power level throughout the whole frequency bands by the amplifier of the present invention comprising a frequency characteristic shown in FIG. 3, even upon increase of the load impedance at the minimum resonance frequency $f_0$. Accordingly, the sound pressure level of the speaker becomes flat throughout the frequency bands including the frequency $f_0$, and it is possible to reproduce extremely low sounds. In addition, the current distortion of the current which flows through the voice coil of the speaker is drastically improved by the current negative feedback circuit.

In this embodiment of the present invention, the frequency characteristic of the above voltage negative feedback circuit and current negative feedback circuit are selected so that the level attenuation quantity and the level intensification quantity at the minimum resonance frequency $f_0$ are the same. For this reason, when the load 13 is of pure resistance having no impedance component as in the speaker, a flat frequency characteristic throughout all the frequency bands can be obtained as shown by dotted lines in FIG. 3.

Figure 2:
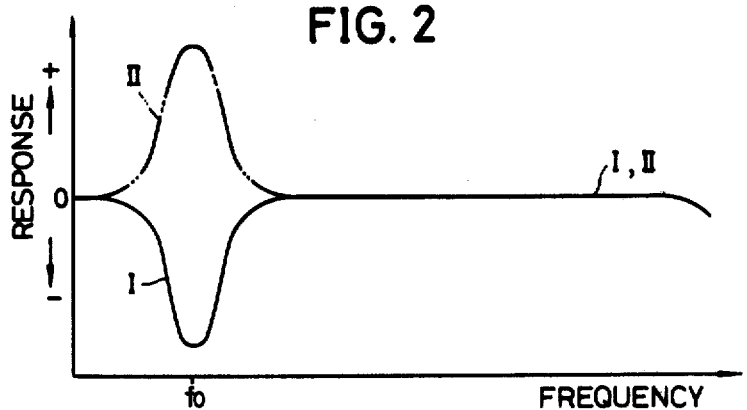
FIG. 2 is a graph showing the frequency characteristics of a voltage negative feedback circuit and a current negative feedback circuit of the negative feedback amplifying circuit of FIG. 1.

In addition, a voltage negative feedback circuit, current negative feedback circuit, and series resonance circuit are used to obtain frequency characteristics shown by the curves I and II in FIG. 2, and thus, from the cost point of view, the amplifying circuit is less expensive compared to the case where a band-pass filter is used.

Figure 4:
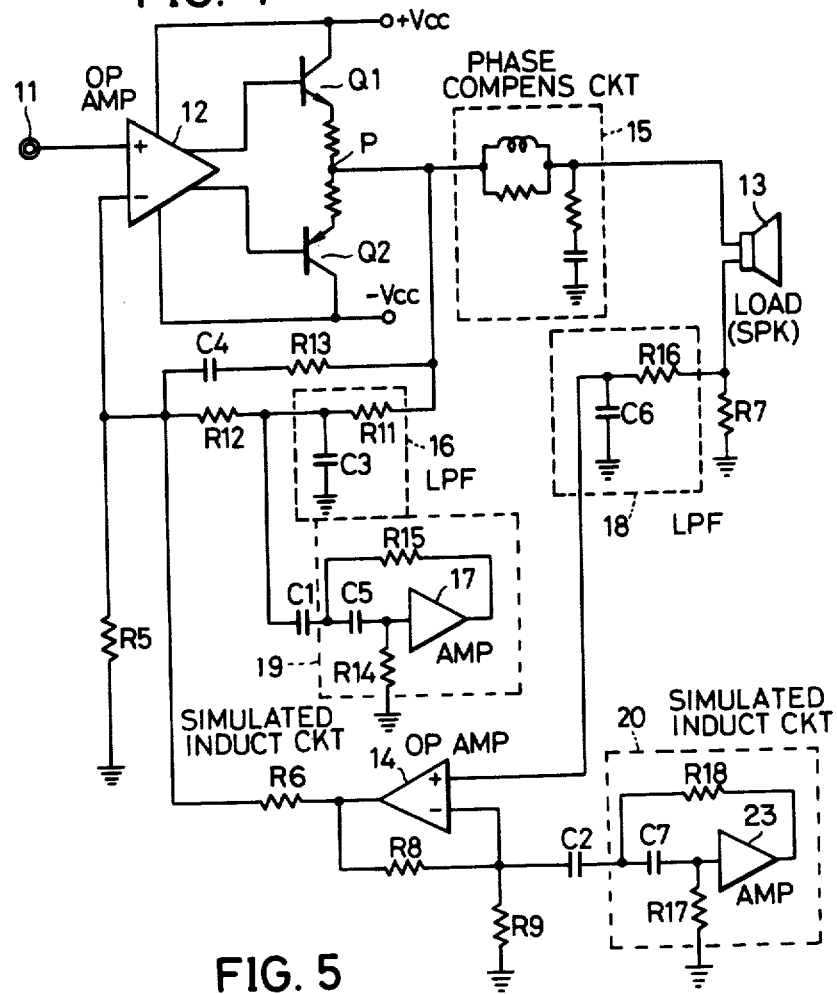
FIG. 4 is a circuit diagram showing a second embodiment of a negative feedback amplifying circuit of the present invention.

Next, a second embodiment of a negative feedback amplifying circuit according to the present invention will be described in conjunction with FIG. 4. In FIG. 4, those parts which are the same as the corresponding parts in FIG. 1 will be designated by like reference numerals and their description will be omitted.

A phase compensation circuit 15 which compensates the phase change due to the capacitance component of the load, is connected between the point P and the load 13. The point P is connected to the inverting input terminal of the operational amplifier 12 through a low-pass filter 16 comprising a resistor R11 and a capacitor C3 and having a low-pass filter characteristic of slope $-6$ dB/oct., and also through a resistor R12.

A series resonance circuit comprising the capacitor C1 and an inductance circuit (referred to as simulated inductance circuit hereinafter) simulated by a semiconductor circuit comprising a capacitor C5, resistors R14 and R15, and an operational amplifier 17, is connected between the ground and the connection point between the low-pass filter and the resistor R12. In addition, a series connected circuit comprising a resistor R13 and a capacitor C4 is connected in parallel with a series connected circuit comprising the low-pass filter 16 and the resistor R12.

Upon use of an ordinary operational amplifier as the amplifier 17, the slew-rate in the high-frequency bands of the amplifier is generally poor, and the distortion factor becomes worse. For this reason, in order not to supply a high-frequency component higher than approximately 500 Hz, for example, to the amplifier 17, the low-pass filter 16 is provided. On the other hand, by just providing the low-pass filter 16, the high frequency components higher than approximately 500 Hz are not fed back, and thus, by further providing the series connected circuit comprising the above resistor R13 and capacitor C4, the high-frequency components are fed back through this series connected circuit. The above low-pass filter 16, resistors R12 through R15, capacitors C1, C4, and C5, and amplifier 17 construct a voltage negative feedback circuit.

A low-pass filter 18 comprising a resistor R16 and a capacitor C6 is connected between the load 13 and the non-inverting input terminal of the operational amplifier 14. A series resonance circuit comprising the capacitor C2, and a simulated inductance circuit 20 comprising a capacitor C7, resistors R17 and R18, and an amplifier 23 is connected in parallel with the resistor R9. The above low-pass filter 18, resistors R6, R8, and R9, capacitor C2, operational amplifier 14, and simulated inductance circuit 20 construct a current negative feedback circuit.

When regular coils $L_1$ and $L_2$ are used in the series resonance circuits as in the above first embodiment, distortion introduced due to the coil is large, and a high fidelity amplifier cannot be constructed. However, the simulated inductance circuit comprising semiconductor circuits, used as an inductance component of the series resonance circuit as in this embodiment, is used, and hence distortion factor upon use of coils is not introduced, and a high fidelity amplifier can be realized.

Figure 5:
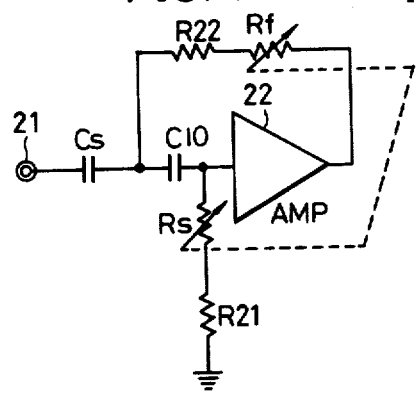
FIG. 5 is a circuit diagram for description showing another embodiment of a part of the negative feedback amplifying circuit of FIG. 4.

Another embodiment of the simulated inductance circuits 19 and 20 is shown in FIG. 5. In the circuit of this embodiment, a variable resistor is provided, so that the resonance frequency can be variably adjusted.

A variable resistor Rs and a resistor R21 are connected in series between the input side of an amplifier 22 and the ground. Capacitors Cs and C10 are connected in series between the input side of the amplifier 22 and a terminal 21. A variable resistor Rf and a resistor R22 are connected in series between the output side of the amplifier 22 and the connection point between the capacitors Cs and C10. The variable resistors Rs and Rf are linked. In the above circuit, the circuit part excluding the capacitor Cs is constructed of simulated inductance circuit comprising inductance components.

The resonance frequency f of the series resonance circuit comprising the simulated inductance circuit and the capacitor Cs, and the quality factor Q, can be described by the following equations (1) and (2).

$$f = \frac{1}{2\pi \sqrt{C_s C_{10}(R21 + R_s)(R22 + R_f)}} \quad (1)$$

$$Q = \sqrt{\frac{C_{10}(R21 + R_s)}{C_s (R22 + R_f)}} \quad (2)$$

Thus, by keeping the ratio between (R21+Rs) and (R22+Rf) constant, and varying the resistance of the variable resistors Rs and Rf so as to vary the product of (R21+Rs) and (R22+Rf), the resonance frequency f can be varied without varying the value of the quality factor Q.

Generally, the minimum resonance frequency $f_0$ of a speaker is determined by the type of the speaker. Accordingly, upon use by changing over the speaker type, this resonance frequency f can be variably adjusted according to the resonance frequency $f_0$ by using the circuit of this embodiment.

Further, this invention is not limited to these embodiments. Variations and modifications may be made without departing from the scope of the invention.

What is claimed is:

1. A negative feedback amplifying circuit comprising:
   (a) an amplifier having positive and negative inputs, the output of said amplifier being coupled to a load comprising a speaker;
   (b) a resistor connected in series with said speaker;
   (c) a voltage negative feedback circuit for feeding back the output voltage of said amplifier to the negative input of said amplifier; and
   (d) a current negative feedback circuit for feeding back a signal, which is a function of the potential difference between both the ends of said resistor, to the negative input of said amplifier, said voltage negative feedback circuit having a frequency selection characteristic having a dip at a specific frequency which is equal to the minimum resonance frequency due to the mechanical impedance of said speaker, and said current negative feedback circuit having a frequency selection characteristic having a peak at said specific frequency.

2. A negative feedback amplifying circuit as claimed in claim 1, in which the frequency selection characteristics of said voltage negative feedback circuit and said current negative feedback circuit are selected so that at said specific frequency, the level attenuation quantity of said voltage negative feedback circuit is substantially equal to the level intensification quantity of said current negative feedback circuit.

3. A negative feedback amplifying circuit as claimed in claim 1, in which both said voltage negative feedback circuit and said current negative feedback circuit contain series resonance circuits having a resonance frequency equal to said specific frequency.

4. A negative feedback amplifying circuit as claimed in claim 3, in which each of said series resonance circuits contain a simulated inductance circuit comprising a semiconductor circuit so as to include an inductance component.

5. A negative feedback amplifying circuit as claimed in claim 4, in which said simulated inductance circuit comprises variable resistors capable of varying said resonance frequency.

6. A negative feedback amplifying circuit as claimed in claim 4, further comprising:
   (a) a first lowpass filter, within said voltage negative feedback circuit, provided between said simulated inductance circuit and the output side of said amplifier;
   (b) a path parallel with said simulated inductance circuit and said first lowpass filter within said voltage negative feedback circuit, for negatively feeding back the frequency components cut off by said first lowpass filter from said amplifier; and
   (c) a second lowpass filter within said current negative feedback circuit provided between said simulated inductance circuit and said resistor.

* * * * *